United States Patent [19]

Morton, Jr.

[11] 4,444,309

[45] Apr. 24, 1984

[54] CARRIER FOR A LEADLESS INTEGRATED CIRCUIT CHIP

[75] Inventor: William D. Morton, Jr., Santa Clara, Calif.

[73] Assignee: Bourns, Inc., Riverside, Calif.

[21] Appl. No.: 350,246

[22] Filed: Feb. 19, 1982

[51] Int. Cl.³ ..................... B65D 85/00; H01R 13/54
[52] U.S. Cl. ................................. 206/329; 206/328; 339/19
[58] Field of Search ................... 206/328, 329, 456; 339/19 R

[56] References Cited

U.S. PATENT DOCUMENTS

| 3,892,312 | 7/1975 | Tems | 206/328 |
| 3,904,262 | 9/1975 | Cutchaw | 206/328 |
| 4,323,155 | 4/1982 | Kling | 206/328 |

*Primary Examiner*—William T. Dixson, Jr.

*Attorney, Agent, or Firm*—William Becker; Richard S. Koppel; Michael D. Harris

[57] ABSTRACT

A carrier for a leadless integrated circuit chip has a cavity into which a chip is laterally inserted through an opening in a side wall of the carrier. A spring arm formed integrally with the carrier flexes backward in a recess to permit insertion of the chip, which has a plurality of electrical contact pads on its upper surface, and then bears against the chip under an internal spring bias to retain it within the cavity. Tabs at the upper corners of the cavity are positioned over the corners of the chip which are free of electrical contact pads, thereby preventing the chip from escaping while exposing the pads for both single and dual pin probing. The external configuration of the carrier conforms to industry standards so that the chip can be fully processed and tested without removing it from the carrier.

12 Claims, 5 Drawing Figures

CARRIER FOR A LEADLESS INTEGRATED CIRCUIT CHIP

BACKGROUND OF THE INVENTION

1. Field of the Invention

This invention relates to carrier devices for holding electronic components during testing and processing, and more particularly to a carrier for an integrated circuit chip which has surface electrical contact pads but no leads.

2. Description of the Prior Art

Various carrier devices have been developed to hold a semiconductor chip during testing and manufacturing operations. The available carriers are generally designed for standard chips with an array of lead pins extending out from the opposite sides of the chip. These carriers typically hold the chip in place by means of lips or rails which extend over the top of the chip along opposed edges. With this type of arrangement the upper surface of the chip is partially covered, but electrical connections with the chip can be made while the chip is still in the carrier by contacting its leads. The carriers are generally designed with industry standard outer geometries to facilitate automatic handling in bowl feeds, etc.

The above type of carrier can also be employed to hold a leadless chip, which is a chip in which electrical connections are made by contacting conductive pads on the upper surface of the chip directly, without the use of leads. Unfortunately, present carriers are not specifically designed for leadless chips, and the type of testing that can be performed while the chip is still in the carrier is limited because the lips or rails typically block at least part of the surfaces of some of the contact pads. While enough of the pad area is usually exposed for probing by a single pin, difficulties are encountered when it is desired to probe a pad with two pins simultaneously. Such double pin contact is employed in a testing technique commonly referred to as Kelvin probing. With this technique probing by the second pin is used either for redundant testing, or as a safety device in which the second probe is used to prevent the imposition of an accidental overload on the chip from the first probe. With conventional chip carriers Kelvin probing is not feasible because of the partial blockage of at least some of the contact pads.

U.S. Pat. No. 3,417,865 to Suverkropp et al. is illustrative of a prior type of chip carrier. It discloses a carrier which is designed for a chip with leads, the leads being received in a series of grooves formed between longitudinal ribs on the upper surface of the carrier. Some of the ribs are extended so that they overlie an open area reserved for the chip and hold the chip in place, the chip being inserted by placing it over these ribs and forcing it down until the ribs snap in place overhead. Another prior art carrier is shown in U.S. Pat. No. 3,652,974 to Tems. In this patent flexible side walls surrounding the chip area flex outward to permit the insertion of a chip, and then flex back against the chip to hold it in place. Retainer projections extend from the side walls over the chip to hold it down. In U.S. Pat. No. 3,604,557 to Cedrone the chip is placed in a recess which can be widened by squeezing the carrier to permit insertion of the chip, with the side walls gripping the chip when the carrier is released. A series of ribs are provided along opposite sides of the recess to accommodate the leads, and also extend over the chip to hold it in place. In all of these patents it is possible for at least some of the contact pads of a leadless chip to be blocked sufficiently to prevent Kelvin probing. In addition, the chips are loaded and unloaded from the top by applying pressure directly onto their major plane, and accordingly are stressed to a greater degree than if they could be loaded from the side without having to press down into the plane of the chips.

Other testing devices are available, commonly referred to as "naked handlers", which present individual chips to a contacting device without the use of a carrier. Leadless chips are so small, however, that Kelvin probing generally cannot be accomplished with these devices unless the chip is held in place. Holding devices are available, but they extend over the upper surface of the chip so as to partially block at least some of the contact pads, resulting in the same problem of access to the pads of a leadless chip as in conventional carrier devices.

One type of chip holder that does not cover up part of the contact pads of a leadless chip is a test socket which is normally committed to a printed circuit board for burn-in testing. This type of socket, however, is not mobile and does not lend itself to automatic loading of the chip into various testing and manufacturing machines, and is top loaded.

SUMMARY OF THE INVENTION

In view of the above problems associated with the prior art, it is an object of the present invention to provide a novel and improved carrier specifically designed for leadless integrated circuit chips which is mobile and securely holds the chip during automatic handling operations, yet leaves all of the chip's contact pads exposed for either single or dual pin probing.

Another object of the invention is the provision of an inexpensive and reliable carrier for leadless integrated circuit chips which can be used without modification in existing handling devices.

These and other objects are accomplished in the present invention by the provision of a carrier body having a cavity which extends inwardly from its upper surface and is of sufficient size to accommodate a leadless chip with the chip's contact pads substantially fully exposed from the top. One of the side walls of the carrier has an opening which extends inwardly to the cavity, permitting a leadless chip to be side-loaded into the cavity through the opening with the bottom of the chip supported by the cavity floor and its upper surface exposed. A spring means extends into the cavity to at least partially block the introduction of a chip, but it can be moved to a position permitting the introduction or removal of the chip through the opening. When released the spring means bears against the chip under the force of its spring bias to hold the chip in a fixed position within the cavity.

The spring means is preferably implemented as a generally L-shaped cantilevered arm which extends through a recess in the carrier body and into the cavity in the vicinity of the side wall opening. The recess provides enough room for the arm to be flexed backward during insertion or removal of a chip. The arm is preferably formed integrally with the body from a stiffly flexible material.

The chip is held down in the cavity by means of tabs extending from the body into the upper portion of the cavity between electrical contact pads on the chip.

With a rectangular or square chip, three tabs are provided over three respective corners of the chip, while the spring arm bears against the remaining chip corner. The carrier body is formed with an industry standard geometry to facilitate its automatic handling.

Other features and objects of the invention will be apparent to those skilled in the art from the following detailed description of a prefered embodiment, taken together with the accompanying drawings, in which:

DETAILED DESCRIPTION OF A PREFERRED EMBODIMENT

Figure 1:
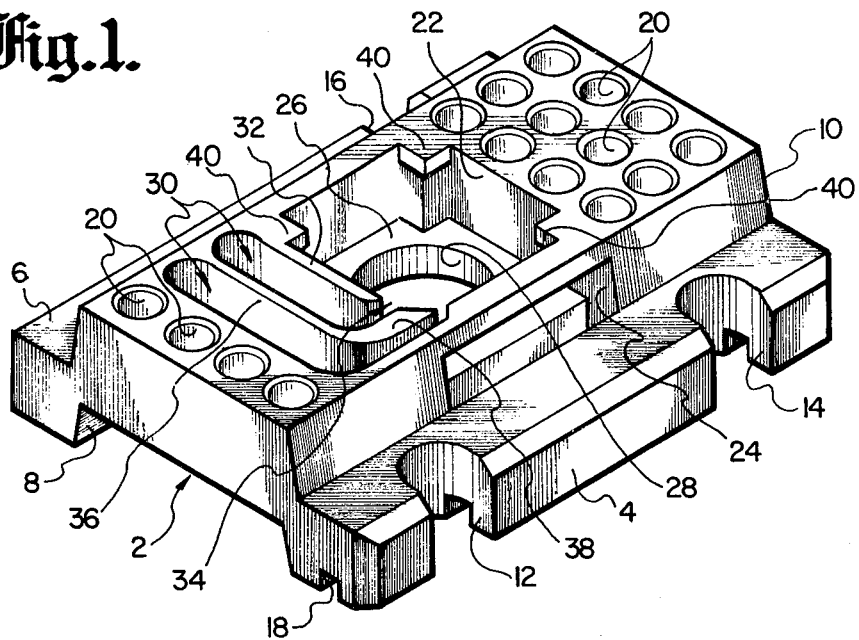
FIG. 1 is a perspective view of a leadless chip carrier constructed in accordance with the invention.

A preferred form of the leadless chip carrier is shown in FIG. 1. The carrier consists of a body 2 having a standard exterior shape to facilitate automatic handling of the carrier and the integrated circuit chip which it holds. The body has a wide base section with two lateral wings 4 and 6, a central channel 8 running the length of the carrier along its underside, and a raised central portion 10 for receiving a chip. A pair of vertical slots 12 and 14 are cut through wing 4, and a single vertical slot 16 is cut through wing 6 to permit automatic alignment of the carrier in environmental handling machines; the sizes and positions of the slots and also of wings 4 and 6 are industry standards. A groove 18 cut into the underside of wing 4 enables the carrier to be aligned on a track in a bowl feed apparatus. An array of vertical appertures 20 is provided in the central portion of the carrier to facilitate automatic identification of the carrier during testing and processing, as explained in further detail in my co-pending patent application Ser. No. 320,245, filed on the same date as the present application.

Extending inwardly from the upper central surface of the carrier body is a cavity 22, the lateral dimensions of which are slightly larger than a standard leadless integrated circuit chip which it is designed to hold. The cavity is rectangular, specifically square, to accommodate a generally square chip. A generally rectangular opening 24 extends through one of the side walls of the carrier body bounding cavity 22 to provide lateral access to the cavity. Opening 24 is large enough to permit the insertion of a standard leadless chip into the cavity, which has a floor 26 at its lower end to support the chip. A circular opening 28 is centrally located in the floor to assist in equalizing the temperature at the upper and lower surfaces of the chip.

Adjacent one side of the cavity is a recess 30 which is separated from the cavity by a thin wall 32. Wall 32 extends toward one end of opening 24 but stops short of the carrier wall in which the opening is formed, leaving a gap 34. A spring means in the form of a cantilevered, generally L-shaped arm 36 extends through the recess from the carrier body at the end of recess 30 opposite opening 24, and terminates in a head 38 at the base of the L which protrudes into the cavity through gap 34.

Arm 36 is formed from a stiffly flexible material so that it can be bent back from the cavity and then released to return to its original position with the end of head 38 extending into the cavity and partially blocking opening 24. It is preferably formed integrally in a one-piece construction with the remainder of the carrier, thereby permitting the entire carrier to be formed from a single mold. Any stiffly flexible rubber or plastic material which is capable of withstanding the environmental test conditions to which an integrated circuit chip is likely to be subjected may be used. Typically, the carrier material should be able to withstand a temperature range of from $-65°$ C. to $200°$ C. without a significant variance in the spring-like qualities of arm 36.

In order to hold a chip down within the cavity, tab-like projections 40 extend into the cavity from the upper ends of the three cavity corners removed from head 38. The tabs are provided at the corners of the cavity in order to avoid interferring with vertical access to any of the electrical contact pads on a leadless chip, the pads of which are typically positioned away from the corners.

Figure 2:
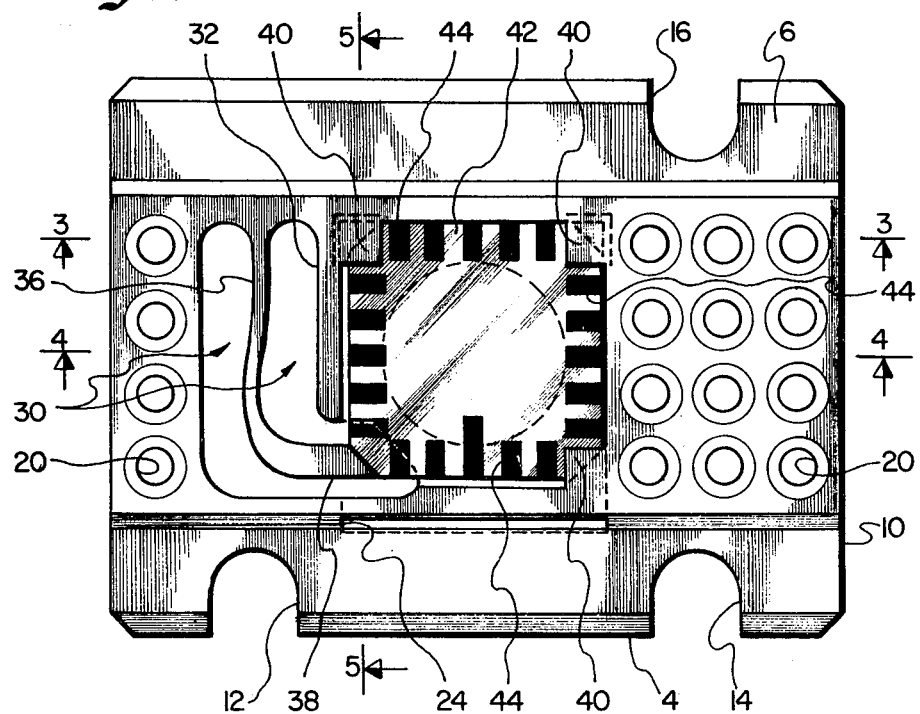
FIG. 2 is a plan view of the carrier showing a leadless chip held in place.

Referring now to FIG. 2, a typical leadless integrated circuit chip 42 is shown supported on the cavity floor 26 after insertion into the cavity through opening 24. Chip 42 has a plurality of contact pads 44 which extend inwardly from its edges along its upper surface. These pads are generally about 0.025 inch wide and about 0.050 inch long, and are connected to integrated circuitry (not shown) on the chip. Each corner of the chip is chamfered, and the head 38 of spring arm 36 is similarly chamfered so that it makes a broad surface contact with and bears against one corner of the chip, forcing the chip back into the cavity and away from opening 24.

Arm 36 normally extends into the cavity by about 0.01 inch inwardly of the outer circumference of a 0.35 inch square chip. When loading the chip into the carrier, spring arm 36 is first bent backwards to move head 38 out of the cavity area and prevent its blocking entry of the chip through opening 24. The chip is then inserted from the side through opening 24, and arm 36 is released so that it bears against the corner of the chip to retain it within the carrier with a spring bias resulting from its approximately 0.01 inch deflection. The flexing of arm 36 is somewhat exaggerated in FIG. 2 for purposes of illustration.

Figure 3:
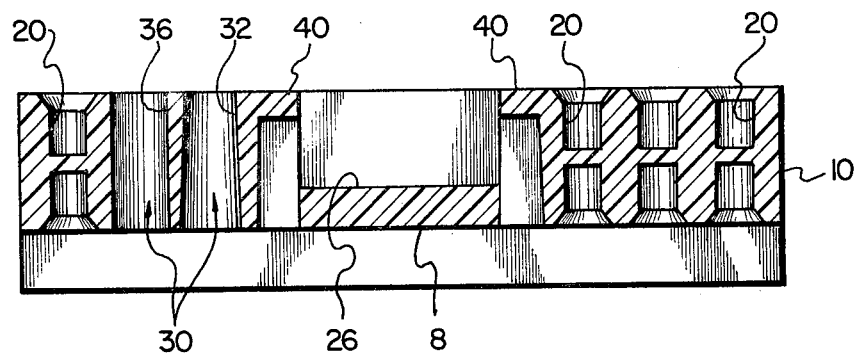
FIGS. 3-5 are respectively views taken along the lines 3—3, 4—4 and 5—5 of FIG. 2, with the leadless chip removed from the carrier.
Figure 4:
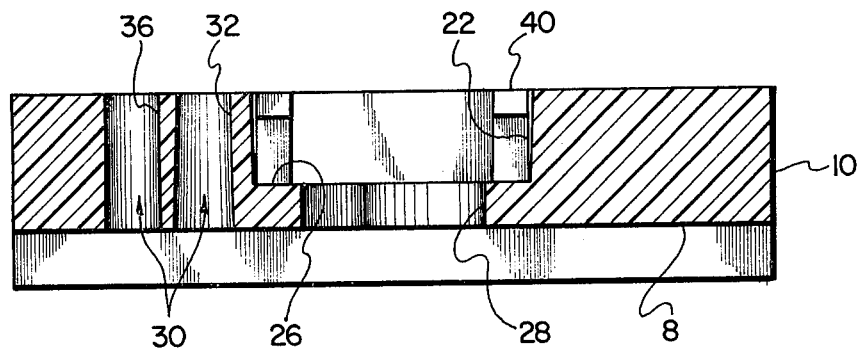
Figure 5:
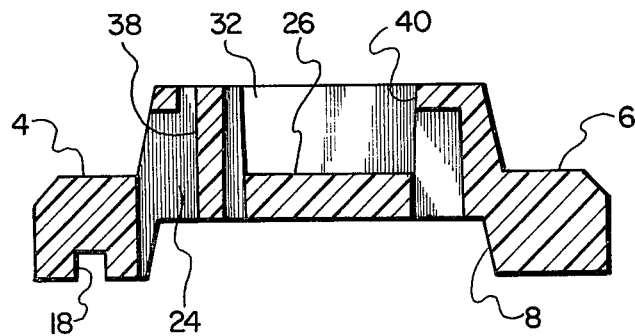

FIGS. 3-5 show further details of the carrier construction. As shown, spring arm 36, divider wall 32 and recess 30 extend vertically all the way through the carrier from its upper surface down to channel 8. Arm 36, which is about 0.02 inch thick, and divider wall 32 are slightly tapered to facilitate removal of the carrier from a mold.

The carrier described above holds a leadless chip securely in place and can be used with standard automatic handling equipment. To load a chip, spring arm 36 is merely flexed backward, the chip is inserted through opening 24 all the way into the cavity, and arm 36 is released, securing the chip in place. Alternately, the end of head 38 on the spring arm could be shaped so that the arm is automatically deflected out of the way by the chip as the chip is inserted into the cavity, and then springs back into place when the chip is all the way in, thus avoiding the necessity of separately flexing the arm backwards. In either case, only a gentle pressure need be applied to the chip parallel to its major plane, as opposed to prior art carriers in which the chip is snapped into place by pressure applied from above. The chip is removed by again flexing arm 36 backwards and taking the chip out through opening 24, or merely by applying enough pressure to the chip so that it moves arm 36 back by itself. All of the electrical contact pads on the chip are fully exposed from above, enabling the chip to be moved through all testing and processing steps including Kelvin probing without removing it from the carrier.

While a particular embodiment of the invention has been shown and described, various modifications and alternative embodiments will occur to those skilled in the art. For example, numerous types of spring devices to hold the chip in place within the carrier cavity could be envisioned. It is accordingly intended that the invention be limited only in terms of the appended claims.

I claim:

1. A mobile carrier for a leadless integrated circuit chip, said chip having an upper surface with a plurality of spaced electrical contact pads, said carrier comprising:

a body having an upper and lower surface, a plurality of side walls, a cavity extending inwardly from the upper surface, said cavity being laterally bounded by the body and large enough to accomodate a chip with its contact pads substantially fully exposed from the top, and a floor at the lower end of the cavity for supporting a chip, one of said side walls having an access opening extending inwardly to the cavity to permit the introduction of a chip into the cavity through the access opening with the bottom of the chip supported by the cavity floor and its upper surface substantially exposed, a plurality of projections formed integrally with the carrier body and extending into the upper portion of the cavity to block the upward removal of a chip located within the cavity and the downward placement of a chip into the cavity from above the carrier, said projections being vertically aligned with spaces on the chip between the contact pads, and thereby enabling the contact pads to be probed from above, and a spring means supported on said body and normally extending into said cavity in blocking relationship to the access openings to at least partially block the introduction of a chip into the cavity, said spring means being movable to a position permitting the introduction or removal of a chip through the access opening, and when released bearing against a chip in the cavity under a spring bias to hold the chip in a fixed position within the cavity.

2. The leadless chip carrier of claim 1, said spring means comprising a stiffly flexible arm having a chip engaging head, said arm being carried on said body with its head normally extending through an opening in a lateral wall of the cavity to a position bearing against and retaining a chip therein, said body including a recess to accommodate flexing of the arm away from its normal position so as to enable a chip to be introduced into the cavity.

3. The leadless chip carrier of claim 2, said body being formed from a stiffly flexible material, and said arm being formed integrally with and cantilevered from the body.

4. The leadless chip carrier of claim 1, designed for a generally rectangular chip, wherein the cavity is similarly generally rectangular and of slightly larger dimensions than the chip, said projections extending from a plurality of the corners of the cavity.

5. The leadless chip carrier of claims 1 or 2, said body being formed with an industry standard outer geometry to facilitate automatic handling of the carrier in testing and processing operations.

6. The leadless chip carrier of claims 1 or 2, said chip supporting floor having an opening therein to facilitate environmental temperature equalization between the upper and lower surfaces of a chip held in the carrier.

7. A mobile carrier for a leadless integrated circuit chip, said chip having an upper surface with a plurality of spaced electrical contact pads, said carrier comprising:

a body having upper and lower surfaces, a plurality of side walls, a cavity extending inwardly from the upper surface, said cavity being laterally bounded by the body and large enough to accomodate a chip with its contact pads substantially fully exposed from the top, and a floor at the lower end of the cavity for supporting a chip, one of said side walls having an access opening extending inwardly to the cavity to permit the introduction of a chip into the cavity through the access opening with the bottom of the chip supported by the cavity floor and its upper surface exposed, a recess formed in a portion of the body lateral to the access opening, said recess opening into the cavity adjacent the access opening, a cantilevered arm formed from a stiffly flexible material extending from the body through the recess and into the cavity in the vicinity of the access opening, said arm being angularly oriented so as to assume a flexed position bearing against a chip placed in the cavity and retaining the chip under flexed spring tension within the cavity, said recess providing space for flexing the arm outward from the cavity to permit the introduction or removal of a chip, and blocking means carried on the body and projecting into the upper portion of the cavity for blocking the upward movement of a chip placed in the cavity and the downward placement of a chip into the cavity from above the carrier, said blocking means being vertically positioned substantially only over portions of the chip not occupied by a contact pad.

8. The leadless chip carrier of claim 7, said recess being separated from the cavity by a divider wall, said divider wall extending toward the body wall with the chip opening but terminating short of said wall to leave a gap therebetween, said arm extending through the recess and having a head which protrudes through the gap to bear against a chip in the cavity.

9. The leadless chip carrier of claim 8, said arm comprising a generally L-shaped member with its base protruding through the gap.

10. The leadless chip carrier of claim 8, adapted for a generally rectangular chip with electrical contact pads spaced from its corners, said cavity similarly being generally rectangular and slightly larger in dimension than said chip, the head of said stiffly flexible arm protruding through said gap in the dividing wall to bear against a corner of the chip, and said blocking means comprising three tabs extending from the body into the cavity slightly over the other three chip corners, respectively.

11. The leadless chip carrier of claim 7, adapted for a generally rectangular chip with electrical contact pads spaced from its corners, said cavity similarly being generally rectangular and slightly larger than said chip, and said blocking means comprising a plurality of tabs extending from the body into the cavity from a plurality of the cavity corners.

12. The leadless chip carrier of claims 7 or 8, said body being formed from a stiffly flexible material and said spring arm being formed integrally therewith.

* * * * *

UNITED STATES PATENT OFFICE
CERTIFICATE OF CORRECTION

Patent No. 4,444,309   Dated April 24, 1984

Inventor(s) William D. Morton, Jr.

It is certified that error appears in the above-identified patent and that said Letters Patent are hereby corrected as shown below:

Column 3, Line 41:   "Ser. No. 320,245" should read -- Ser. No. 350,245 --

Signed and Sealed this

Thirtieth Day of October 1984

[SEAL]

Attest:

GERALD J. MOSSINGHOFF

Attesting Officer    Commissioner of Patents and Trademarks